United States Patent [19]

Kondo et al.

[11] Patent Number: 4,871,608
[45] Date of Patent: Oct. 3, 1989

[54] HIGH-DENSITY WIRING MULTILAYERED SUBSTRATE

[75] Inventors: Kazuo Kondo; Asao Morikawa; Hiroshi Iwata; Yoshimasa Shibata, all of Aichi, Japan

[73] Assignee: NGK Spark Plug Co., Ltd., Aichi, Japan

[21] Appl. No.: 133,817

[22] Filed: Dec. 10, 1987

[30] Foreign Application Priority Data

Dec. 10, 1986 [JP] Japan .............................. 61-294459
May 21, 1987 [JP] Japan .............................. 62-122486
May 26, 1987 [JP] Japan .............................. 62-129441

[51] Int. Cl.⁴ .............................................. B32B 9/00
[52] U.S. Cl. ................................... 428/209; 428/210; 428/432; 428/433; 428/689; 428/702; 428/901; 106/1.13; 106/1.14; 106/1.18; 106/1.19; 106/1.25; 252/512; 252/518; 252/520
[58] Field of Search ....................... 252/512, 518, 520; 106/1.13, 1.14, 1.18, 1.19, 1.25; 428/209, 210, 432, 433, 689, 702, 901; 156/89, 901

[56] References Cited

U.S. PATENT DOCUMENTS

| | | | |
|---|---|---|---|
| 2,720,573 | 10/1955 | Lundqvist | 252/518 |
| 3,324,049 | 6/1967 | Holmes | 106/1.13 |
| 3,450,545 | 6/1969 | Ballard et al. | 106/1.13 |
| 3,502,489 | 3/1970 | Cole | 106/1.13 |
| 3,681,135 | 8/1972 | Cheary | 106/1.13 |
| 3,776,769 | 12/1973 | Buck et al. | 252/518 |
| 3,896,055 | 7/1975 | Bouchard et al. | 252/518 |
| 4,001,146 | 1/1977 | Horowitz | 106/1.13 |
| 4,670,189 | 6/1987 | Tomibe et al. | 252/518 |
| 4,678,505 | 7/1987 | Bushey | 252/518 |
| 4,687,597 | 8/1987 | Siuta | 106/1.13 |

FOREIGN PATENT DOCUMENTS 0151320 11/1980 Japan .................................. 106/1.13

OTHER PUBLICATIONS

Hackh's Chem. Dictionary, pp. 1219–1220, 4th Ed., Julius Grant.

Primary Examiner—Ellis P. Robinson
Assistant Examiner—P. J. Ryan
Attorney, Agent, or Firm—Sughrue, Mion, Zinn, Macpeak & Seas

[57] ABSTRACT

A high-density wiring multi-layered substrate comprising a plurality of sequentially laminated green sheets containing crystallizable glass, each of the green sheets having a conductor paste on the surface thereof, the conductive component of the conductor paste comprising at least about 80 wt % of one copper component selected from copper and copper oxide and at least one member selected from up to about 15 parts by weight of $MnO_2$ and up to about 10 parts by weight of $Ag_2O$ based on 100 parts by weight of said copper component in terms of metallic copper.

2 Claims, 1 Drawing Sheet

HIGH-DENSITY WIRING MULTILAYERED SUBSTRATE

FIELD OF THE INVENTION

The present invention relates to a novel multi-layered substrate having high-density wiring such as a pin grid array IC package accommodating a multitude of pins. The present invention also relates to a process for producing such a multilayered substrate.

BACKGROUND OF THE INVENTION

Crystallizable glass has many advantageous characteristics such as a thermal expansion coefficient close to that of silicon, a low dielectric constant, and a capability for firing at low temperatures. Therefore, high-density wiring substrates employing insulators that contain crystallizable glass in a major or minor amount and which are coated with conductive materials selected from among low-melting, low-resistance metals such as Ag and Cu have been widely used. A method has been proposed in Japanese Patent Application (OPI) No. 128899/1980 (term "OPI" hereinafter means unexamined Japanese Patent Application) in which a glassceramic structure is by first preparing an unfired ceramic sheet (hereinafter referred to as a green sheet) from glass particles that crystallize at a temperature lower than the melting point of copper, then printing a circuit pattern of a copper paste on the surface of the green sheet, laminating a plurality of thus-patterned green sheets into a unitary assembly, and firing the assembly in a pre-selected atmosphere such as a reducing atmosphere or an inert gas atmosphere.

The term "green sheet" as used herein means a "precursor" which forms a crystalline glass product when sintered; that is a material that can be fired at low temperatures and which possesses a comparatively low dielectric constant, a low thermal expansion coefficient and a great strength after firing. Such a green sheet may be prepared by the following procedures: a crystallizable glass component is prepared by adding 0.1–6 wt % of $B_2O_3$ and/or $P_2O_5$ to a mixture of main ingredients comprising 57–60 wt % of $SiO_2$, 20–28 wt % of $Al_2O_3$, 10–18 wt % of MgO and 2–6 wt % of ZnO; 100 parts by weight of the crystallizable glass component is ground into particles to form a first; 15 parts by weight of a butyral resin, 8 parts by weight of a plasticizer such as dibutyl phthalate, and 30 parts by weight of a solvent comprising a liquid mixture of acetone and toluene are added to the frit; the mixture is kneaded in a pot mill for about 48 hours to make a slurry; the slurry is then formed into a sheeting of a desired thickness by a suitable technique such as doctor blading.

The green sheet is also disclosed in Japanese Patent Application (OPI) Nos. 64545/84, 83957/84 and 137341/84.

In order to meet the demands of modern electronic devices and components featuring an ultra-high packaging density, higher performance characteristics and a lower production cost, it has been desired to develop a multi-layered substrate that is made of a copper-based conductive paste on a circuit substrate and in which the conductor area is more gas-tight than a conductor solely made of copper. It has also been desired that such a multi-layered substrate have an enhanced strength of adhesion to the copper paste after firing.

When a paste that is based on copper oxide is heated in a reducing atmosphere or an inert gas atmosphere, CuO is reduced to Cu which is electrically conductive. During this process, the paste undergoes a decrease or contraction in volume. On the other hand, a paste that is based on metallic copper undergoes an increase or expansion in volume as a result of oxidation of Cu during degreasing in the air atmosphere. Such a contraction or expansion in volume can cause cracking in the ceramic portion formed by firing the green sheet or in the conductor area.

If holes extending through ("through-holes") the ceramic portion are filled with a conductor paste, not only does the contraction described above occur, but also a thermal contraction mismatch that occurs between Cu and the ceramic portion during firing can produce either a gap between the inner surface of such holes and the conductor or cracking in the conductor area, thereby leading to poor electrical conduction.

SUMMARY OF THE INVENTION

An object, therefore, of the present invention is to solve the aforementioned problems of the prior art and to provide a high-density wiring multi-layered substrate that has a conductor portion with superior performance characteristics and which employs crystallizable glass as the insulator substrate material.

This and other objects of the present invention can be attained by providing a conductor paste the conductive component of which comprises at least about 80 wt % of at least one copper component selected from copper and copper oxide and at least one member selected from up to about 15 parts by weight of $MnO_2$ and up to about 10 parts by weight of $Ag_2O$ based on 100 parts by weight of the copper component in terms of metallic copper, printing a circuit pattern of the conductor paste on the surface of a green sheet, and performing reductive firing of the thus-patterned sheet in a pre-selected atmosphere.

If desired, the strength of adhesion of the conductor paste to the green sheet may be enhanced by incorporating in the paste up to 4 parts by weight of $TiO_2$ or $TiH_2$ or both per 100 parts by weight of the copper component.

In order to further improve the gas-tightness characteristic of the conductor paste, about 20 to about 80 parts by weight of at least one member selected from Pd and Pt and at least one member selected from up to about 10 parts by weight of $MnO_2$ and up to about 5 parts by weight of $Ag_2O$ may be added to 100 parts by weight of a copper component comprising about 50 to about 90 wt % of CuO and about 10 to about 50 wt % of Cu.

DETAILED DESCRIPTION OF THE INVENTION

Figure 1:
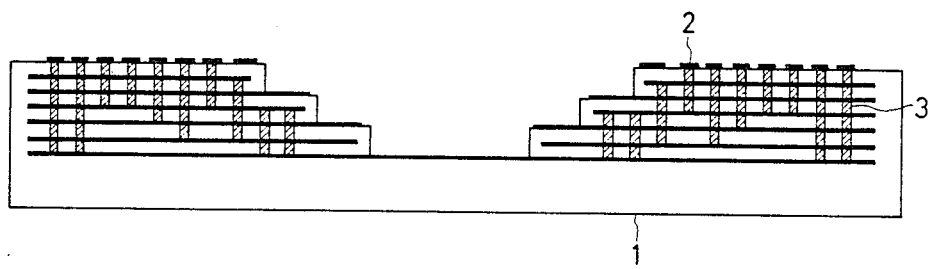
FIG. 1 is a cross section of a multi-layered substrate produced according to one embodiment of the present invention.

Copper and/or copper oxide in the conductor paste are thermally reduced when the paste is fired in conjunction with the green sheet in a reducing atmosphere such as a reducing gas or in an inert gas atmosphere. As a result of this firing treatment, the paste becomes electrically conductive. In order to ensure the necessary conductivity, the content of the copper component in the paste must be at least about 80 wt % in terms of metallic copper. Manganese dioxide ($MnO_2$) in the paste is reduced to $Mn_2O_3$, $Mn_3O_4$, MnO or Mn to increase the wetting ability of Cu with the ceramic or crystallizable glass in the substrate. If the content of $MnO_2$ exceeds 15 parts by weight per 100 parts by weight of the copper component, sintering of copper particles is inhibited thus causing a leakage problem or increased resistance. Therefore, the content of $MnO_2$ in the conductor paste is desirably no more than about 15 parts by weight. Silver (I) oxide ($Ag_2O$) in the paste is reduced to Ag by reduction at 100° C. in a hydrogen atmosphere and forms a liquid phase of Cu-Ag alloy, commonly referred to as "silver solder", in local areas of the interface between copper particles, thereby allowing them to be densely sintered. If the content of $Ag_2O$ exceeds about 10 parts by weight per 100 parts by weight of the copper component, the silver solder will form beads on the substrate that decrease the strength of adhesion of the paste to the substrate. Therefore, the content of $Ag_2O$ in the conductor paste is desirably no more than about 10 parts by weight.

The conductor paste comprising the components described above has an adhesive strength of about 0.5 $kg/mm^2$ with metal wires or the like being attached to a circuit pattern on the uppermost surface of a multilayered substrate fabricated by employing said paste. In order to further improve the strength of adhesion between the paste and the substrate, at least one of a titanium compound such as $TiO_2$ and $TiH_2$ may be incorporated in the paste in an amount of up to about 4.0 parts by weight per 100 parts by weight of the copper component. These titanium compounds diffuse from the conductor paste into the green sheet, thereby increasing the adhesion between these two components. If the content of $TiO_2$ and/or $TiH_2$ exceeds 4 parts by weight, these compounds will diffuse into the green sheet in excessive amounts during firing and the resulting ceramic product will have a decreased insulation resistance or ability to withstand high voltages. Also, the fired conductor paste will itself become porous and present an undue resistance to electrical conduction. Titanium compounds other than $TiO_2$ and $TiH_2$ can of course be employed if they are reducible in a firing atmosphere at the temperature used, but $TiO_2$ and $TiH_2$ are most desirable for the purposes of the present invention.

If greater improvement in the gas-tightness characteristic of the conductor paste, is desired, from about 20 to about 80 parts by weight of at least one member selected from Pd and Pt and up to about 10 parts by weight of $MnO_2$ and/or up to about 5 parts by weight of $Ag_2O$ may be added to 100 parts by weight of a copper component comprising about 50 to about 90 wt % of CuO and about 10 to about 50 wt % of Cu. Palladium and platinum cooperate with Cu and CuO to serve to ensure the necessary electrical conductivity. In addition to this advantage, Pd and Pt, which sparingly undergo oxidation or reduction at elevated temperatures, contribute to maintaining a near constant overall volume of the conductor. If the content of Pd and/or Pt is less than about 20 parts by weight per 100 parts by weight of the copper component (Cu +CuO), uneven occurrence of voids or cracks will result. If the content of Pd and/or Pt exceeds about 80 parts by weight per 100 parts by weight of the copper component, the conductor will have an increased resistance which is somewhat unfavorable for the purpose of providing interconnection through a plurality of holes extending through the layers.

If the proportions of CuO and Cu in the paste are determined in such a way that CuO is present in an amount of from about 50 to about 90 wt %, with the balance being Cu, the volume contraction due to the reduction of CuO in the reduction step is compensated for by the volume expansion due to the oxidation of Cu in the degreasing step, and this contributes greatly to the purpose of ensuring a minimum change in the volume of the final product.

A conductor paste suitable for use in the present invention may be prepared by the following exemplary procedures: the ingredients, e.g., CuO, Cu, $Ag_2O$, Pt, Pd, $MnO_2$, $TiO_2$ and $TiH_2$, are ground into particles which are subsequently conditioned to the average particle sizes noted below; measured amounts of these particles are interblended to form a metal powder, mixed with about 10 parts by weight of a binder such as an ethyl cellulose resin for 100 parts by weight of the metal powder, as well as with about 10 parts by weight of a viscous solvent (e.g., butyl carbitol) and about 100 parts by weight of a solvent (e.g., acetone); the mixture is charged into a pot mill which is rotated for 8 hours to form a homogeneous slurry; the slurry is recovered from the pot mill, stirred in $N_2$ gas and dried to obtain a paste from which the solvent has been evaporated.

The above-mentioned particle sizes are as follows:

| | |
|---|---|
| CuO | 2 ($\mu$m) |
| Cu | 3–15 |
| $Ag_2O$ | 0.5 |
| Pt | 3 |
| Pd | 3 |
| $MnO_2$ | 3 |
| $TiO_2$ | 1.5 |
| $TiH_2$ | 5. |

A predetermined circuit pattern of the so prepared conductor paste is formed on the surface of a green sheet by screen printing using, for example, a stainless steel screen having a mesh size of 250–325 (US Standard mesh).

Two typical examples of conductor pastes that are capable of attaining the objects of the present invention have the following weight proportions of metallic ingredients, assuming that CuO is expressed in terms of Cu:

| | A | B |
|---|---|---|
| Cu, CuO | 100 (parts by weight) | 100 (parts by weight) |
| $MnO_2$ | $\leq 15$ | $< 15.6$ |
| $Ag_2O$ | $\leq 10$ | $\leq 10.4$ |
| $TiO_2$, $TiH_2$ | | $\leq 4.0$ |

The lower limits of $MnO_2$, $Ag_2O$, $TiO_2$ and $TiH_2$ can be determined in a functional manner, i.e., as amounts that are capable of attaining the objects of the present invention when they are used independently of each other.

A several layers of the patterned green sheet are laminated on a base sheet and the laminated layers are thermopressed to form a unitary assembly. The resulting assembly are heated, for example, at about 400°—about 750° C., for about 10 —about 30 minutes to remove the binder out, at about 300°—about 600° C. for about 30–90 minutes under reduced atmosphere and at about 850°—about 1,050° C., for about 60–120 minutes for sintering in this order.

The conductor pastes according to the present invention may also be applied on a low temperature sinterable base sheet inclusive of metal sheet of Au, Cu, Ag, etc. Examples of the base sheet are disclosed in Japanese Patent Application (OPI) Nos. 46937/87, 78144/87, 113758/87, 117393/87 and 128964/87, and Japanese Patent Publication No. 18494/87.

There is no particular limitation on the binder and solvent to be used, except that the concentration, composition and other factors of these components should be appropriately selected so as to be readily adaptable to screen printing on a green sheet.

The following examples are provided for the purpose of further illustrating the present invention but are in no way to be taken as limiting. In the examples, all percents and parts are on a weight basis, unless indicated to be otherwise.

EXAMPLE 1

(1) ZnO, MgCO$_3$, Al(OH)$_3$, SiO$_2$, H$_3$BO$_3$ and H$_3$PO$_4$ were measured in such amounts to provide a composition consisting of 4% ZnO, 13% MgO, 23% Al$_2$O$_3$, 58% SiO$_2$, 1% B$_2$O$_3$ and 1% P$_2$O$_5$. These ingredients were mixed in a mixing and grinding machine, melted at 145° C. in an alumina crucible, and quenched in water to form a glassy material. This material was ground in an alumina ball mill to produce a frit consisting of glass particles having an average particle size of 2 $\mu$m.

(2) An organic binder and a solvent were mixed with the frit to form a slurry, which was shaped into a green sheet 0.6 mm thick by doctor blading (this green sheet has the same composition as sample No. 5 prepared in the Examples described in the specification U.S. Pat. No. 4,540,671).

(3) A mixture of 96.5% (on Cu basis) of CuO particles having an average size of 1.5 $\mu$m, 2.5% MnO$_2$ and 1.0% Ag$_2$O was blended with an inorganic binder and a solvent to form a copper paste.

(4) A circuit pattern consisting of 40 conductive strips (40 mm$^L \times$ 0.5 $\mu$m$^W \times$ 20 $\mu$m$^T$) spaced at a distance of 1 mm was formed on the surface of the green sheet prepared in step (2) by screen-printing the copper paste prepared in step (3).

(5) Through-holes (300 $\mu$m$^\phi$) were formed in 200 selected locations of the striped circuit pattern and a similar circuit pattern of strips was formed by performing screen printing on positions where the latter strips would cross over the through-holes at right angles with respect to the strips in the first pattern.

(6) Six layers of the patterned green sheet were laminated on a single unpatterned base sheet that was much thickener than the individual green sheets, and the seven layers were thermocompressed to form a unitary assembly which was subsequently cut into squares measuring 50$\times$50 mm.

(7) The resulting cut pieces of the assembly were heated in an air atmosphere up to 750° C. over a period of 8 hours and held at that temperature for 0.2–1.0 hour.

(8) The pieces were then transferred into a hydrogen atmosphere, in which they were heated from ordinary or room temperature to 350° C. at a rate of 0.5° C./min, held at that temperature for 0.5–1.5 hours and fired at 950° C.

By the sequence of steps (1) to (8), multi-layered substrates 1 were fabricated, each of which comprised, as shown in FIG. 1, of seven insulating substrates having patterned layers 2, 2, . . . 2 electrically interconnected via through-holes 3, 3, . . . 3.

Analysis with a He detector showed that the multi-layered substrates 1 had a gas tightness of 1$\times$10$^{-8}$ cc/std.sec and below. The uppermost pattern on each of the multi-layered substrates 1 was metallized and plated in preparation for brazing fine metal wires. After metal wires were attached to the uppermost pattern, they were pulled to measure the strength of adhesion of the copper paste to the ceramic sheet; the adhesive strength was found to be 0.5 kg/mm$^2$ Comparative multi-layered substrates were fabricated by repeating the sequence of steps (1) to (8) except that MnO$_2$ or Ag$_2$O was not added in step (3). The comparative samples had a gas tightness of 1$\times$10$^{-6}$ cc/std.sec and above and the strength of adhesion between copper paste and ceramic sheet was 0.5 kg/mm$^2$.

EXAMPLES 2–4

A green sheet 0.6 mm thick was prepared by repeating steps (1) and (2) as in Example 1. Subsequent steps were as follows.

(3) Three specimens or copper paste were prepared by blending an organic binder and a solvent to mixtures having the compositions shown in Table 1 below incorporating CuO particles having an average particle size of 1.5 $\mu$m.

A circuit pattern providing conductive layers was formed in a thickness of 20 $\mu$m on the surface of the green sheet by screen-printing the copper pastes prepared in step (3).

(5) Through-holes (300 $\mu$m in diameter) were formed in 200 selected locations of the circuit pattern and filled with the copper pastes prepared in step (3). Green sheets to be subsequently laminated on the first pattern were provided with a similar circuit pattern of strips by screen printing in such a way that the second layer of strips would cross over the through-holes at right angles with respect to the strips in the first pattern.

(6) Six layers of the patterned green sheet were laminated on a single unpatterned base sheet that was much thicker than the individual green sheets, and the resulting seven layers were thermocompressed to form a unitary assembly which was subsequently cut into squares measuring 50$\times$50 mm.

(7) The cut pieces of the assembly were heated in an air atmosphere up to 750° C. and held at that temperature for 0.2 to 1.0 hour.

(8) The pieces were then transferred into a hydrogen atmosphere, in which they were heated from ordinary or room temperature to 350° C. at a rate of 0.5° C./min, held at that temperature for 0.5 to 1.5 hours and reductively fired at 950° C., followed by firing at 950° C. in a nitrogen atmosphere.

By the sequence of the above steps, multi-layered substrates were fabricated, each of which comprised, as shown in FIG. 1, of seven insulating substrates having patterned conductive layers 2, 2, . . . formed on glass substrates 1, 1, . . . that were electrically interconnected via through-holes 3, 3, . . . filled with the copper paste.

Figure 2:
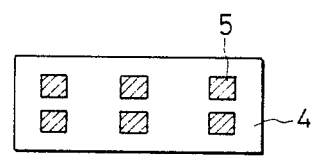
FIG. 2 is a planar view of a test piece that is used to measure adhesive strength.

Analysis with a He detector showed that these multi-layered substrates had a gas tightness of 1$\times$10$^{-8}$ cc/std.sec and below. Specimens for measurement of adhesive strength were prepared as shown in FIG. 2; each specimen had a plurality of square conductors 5 (1.6$\times$1.6 mm) on a crystallized glass substrate 4. Copper wires (0.6 mm in diameter) were bonded to the conductors 5 with a solder (60% Sn/40% Pb) and thereafter pulled up in a vertical direction so as to measure the strength of adhesion of the conductors to the ceramic base 4. The results are shown in Table 1.

TABLE 1

| Run No. | Cu | MnO$_2$ | Ag$_2$O | TiO$_2$ | TiH$_2$ | Adhesive strength* (kg/mm$^2$) | (wt %) Gas tightness (cc/std · sec) |
|---|---|---|---|---|---|---|---|
| Comparative Example | 98.0 | 1.9 | 0.1 | — | — | 0.5 | |
| Example 2 | 91.5 | 6.4 | 0.1 | 2.0 | — | 1.25 | |
| 3 | 97.5 | 1.9 | 0.1 | — | 0.5 | 1.00 | $\leq 1 \times 10^{-8}$ |
| 4 | 90.0 | 7.3 | 0.1 | — | 2.4 | 0.90 | |

*Mean average for n = 3.

Each of the substrate samples prepared in Example 2–4 was metallized with copper and plated with nickel over areas that corresponded to the conductors. A 4 2 alloy fixture was bonded to the metallized pattern with a hightemperature brazing filler material. The adhesive strength of the conductors measured by pulling the alloy fixture was the same as the values measured by pulling soldered copper wires.

EXAMPLE 5

A green sheet having 0.6 mm thick was prepared by repeating steps (1) and (2) as in Example 1. Subsequent steps were as follows.

(3) A CuO powder having an average particle size of 1.5 μm, a Cu powder having an average particle size of 15 μm, a Pd powder having an average particle size of 3 μm, as well as Pt, MnO$_2$ and Ag$_2$O powders each having an average particle size of 3 μm were blended to the formulations shown in Table 2 below. Two samples of conductor paste were then prepared by mixing the blends with an organic binder and a solvent.

TABLE 2

| Paste sample | Copper component (100 parts in all) | | Pd (parts) | Pt (parts) | MnO$_2$ (parts) | Ag$_2$O (parts) |
|---|---|---|---|---|---|---|
| | CuO (%) | Cu (%) | | | | |
| No. 1 | 90 | 10 | 30 | — | 8 | 3 |
| No. 2 | 80 | 20 | — | 60 | 2 | 5 |

(4) A circuit pattern consisting of 40 strips (40 mm$^L$×0.5 mm$^W$×20 μm$^T$) spaced at a distance of 1 mm was formed on the surface of the green sheet prepared in step (2) by screen-printing a conductor paste that was of the same nature as the conductor paste prepared in step (3) except that it did not contain Pd or Pt.

(5) Through-holes (300 μm in diameter) were formed in 200 locations of the striped pattern and filled with a conductor paste of the same type as prepared in step (3). A similar pattern of strips was formed by screen-printing a paste of the same type as used in step (4) in such a way that the second layer of strips would cross over the through-holes at right angles with respect to the strips in the first pattern.

(6) Six layers of the patterned green sheet were laminated on a single unpatterned base sheet that was much thicker than the individual green sheets, and the resulting seven layers were thermocompressed to form a unitary assembly which was subsequently cut into squares measuring 50×50 mm.

(7) The cut pieces of the assembly were heated in an air atmosphere up to 750° C. over a period of 8 hours and held at that temperature for 0.2 to 1.0 hour.

(8) The pieces were then transferred into a hydrogen atmosphere, in which they were heated from ordinary or room temperature to 350° C. at a rate of 0.5° C./min, held at that temperature for 0.5 to 1.5 hours, and fired at 950° C.

By the sequence of steps (1) to (8), multi-layered substrates 1 were fabricated, each of which comprised, as shown in FIG. 1, seven insulating substrates having patterned layers 2, 2, . . . 2 electrically interconnected via through-holes 3, 3, . . . 3.

Analysis with a He detector showed that the multi-layered substrates 1 had a gas tightness of 1×10$^{-8}$ cc/std.sec and below irrespective of whether the conductor pattern was formed of paste sample No. 1 or No. 2.

While the invention has been described in detail and with reference to specific embodiments thereof, it will be apparent to one skilled in the art that various changes and modifications can be made therein without departing from the spirit and scope thereof.

What is claimed is:

1. A high-density wiring multi-layered substrate comprising a plurality of sequentially laminated green sheets of crystallizable glass, each of said green sheets having a conductor paste on the surface thereof, the conductive component of said conductor paste comprising at least about 80% of one copper component selected from copper and copper oxide and at least one member selected from up to about 15 parts by weight of MnO$_2$ and up to about 10 parts by weight of Ag$_2$O based on 100 parts by weight of said copper component in terms of metallic copper.

2. A high density wiring multi-layered substrate according to claim 1, wherein said conductor paste further comprises a titanium compound selected from TiO$_2$ and TiH$_2$ in an amount of up to about 4 parts by weight per 100parts by weight of said copper component in terms of metallic copper.

* * * * *